United States Patent
Lee

(10) Patent No.: US 11,348,644 B2
(45) Date of Patent: May 31, 2022

(54) MEMORY DEVICE FOR PERFORMING DUMMY PROGRAM OPERATION AND OPERATING METHOD THEREOF

(71) Applicant: SK hynix Inc., Icheon-si Gyeonggi-do (KR)

(72) Inventor: Jong Hoon Lee, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 17/068,258

(22) Filed: Oct. 12, 2020

(65) Prior Publication Data

US 2021/0375365 A1 Dec. 2, 2021

(30) Foreign Application Priority Data

May 26, 2020 (KR) .................. 10-2020-0063136

(51) Int. Cl.
 *G11C 16/04* (2006.01)
 *G11C 16/10* (2006.01)
 *G11C 16/34* (2006.01)
 *G11C 16/14* (2006.01)
(52) U.S. Cl.
 CPC .......... *G11C 16/10* (2013.01); *G11C 16/0483* (2013.01); *G11C 16/14* (2013.01); *G11C 16/3459* (2013.01)

(58) Field of Classification Search
 CPC ..... G11C 16/10; G11C 16/3459; G11C 16/14; G11C 16/0483
 USPC .................................... 365/185.17
 See application file for complete search history.

(56) References Cited

U.S. PATENT DOCUMENTS

| 2008/0130363 A1* | 6/2008 | Hosono | ............. | G11C 16/3418 |
| | | | | 365/185.33 |
| 2014/0269079 A1* | 9/2014 | Kamigaichi | ........... | G11C 16/10 |
| | | | | 365/185.24 |

FOREIGN PATENT DOCUMENTS

| KR | 1020160058521 A | 5/2016 |
| KR | 1020180054315 A | 5/2018 |

* cited by examiner

*Primary Examiner* — Tha-O H Bui
(74) *Attorney, Agent, or Firm* — William Park & Associates Ltd.

(57) ABSTRACT

A memory device includes a cell string, a peripheral circuit and a control logic. The cell string includes a select transistor and a plurality of memory cells, and further includes a plurality of dummy cells, wherein the plurality of dummy cells are coupled in series between the select transistor and the plurality of memory cells. The peripheral circuit configured to perform a dummy program operation on the plurality of dummy cells. The control logic configured to control the peripheral circuit so that the plurality of dummy cells have different threshold voltage distributions during the dummy program operation.

19 Claims, 12 Drawing Sheets

MEMORY DEVICE FOR PERFORMING DUMMY PROGRAM OPERATION AND OPERATING METHOD THEREOF

CROSS-REFERENCE TO RELATED APPLICATION

The present application claims priority under 35 U.S.C. § 119(a) to Korean patent application number 10-2020-0063136 filed on May 26, 2020, in the Korean Intellectual Property Office, the entire disclosure of which is incorporated by reference herein.

BACKGROUND

1. Technical Field

Various embodiments of the invention relate generally to an electronic device, and more particularly, to a semiconductor device and an operating method thereof.

2. Related Art

A storage device may store data in response to a host device, such as a computer or a smartphone. A storage device may include a memory device that stores data and a memory controller that controls the memory device. Memory devices may be divided into volatile memory devices and non-volatile memory devices.

A volatile memory device may retain data as long as power is being supplied and may lose the stored data in the absence of power. The types of volatile memory devices may include Static Random Access Memory (SRAM), Dynamic Random Access Memory (DRAM), and the like.

A non-volatile memory device does not lose data even in the absence of power. The types of non-volatile memory devices may include Read Only Memory (ROM), Programmable ROM (PROM), Electrically Programmable ROM (EPROM), Electrically Erasable and Programmable ROM (EEPROM) and flash memory.

SUMMARY

According to an embodiment, a memory device may include a cell string including a select transistor, a plurality of memory cells, and a plurality of dummy cells, wherein the plurality of dummy cells are coupled in series between the select transistor and the plurality of memory cells, a peripheral circuit configured to perform a dummy program operation on the plurality of dummy cells, and a control logic configured to control the peripheral circuit so that the plurality of dummy cells have different threshold voltage distributions during the dummy program operation.

According to an embodiment, a memory device may include a cell string including a select transistor, a plurality of memory cells, and a plurality of dummy cells, wherein the plurality of dummy cells are coupled in series between the select transistor and the plurality of memory cells, a peripheral circuit configured to perform a dummy program operation on the plurality of dummy cells, and a control logic configured to control the peripheral circuit so that a dummy cell that is closer to the plurality of memory cells has a lower threshold voltage than a dummy cell that is farther from the plurality of memory cells during the dummy program operation.

According to an embodiment, a method of operating a memory device including a select transistor, a plurality of memory cells, and a plurality of dummy cells, the plurality of dummy cells being coupled in series between the select transistor and the plurality of memory cells may include applying a dummy cell program voltage to a selected dummy word line among a plurality of dummy word lines that are coupled to the plurality of dummy cells, and applying a different range of dummy cell program verify voltages based on a distance between the selected dummy word line and the plurality of memory cells to the selected dummy word line.

According to an embodiment, a method of operating a memory device including a select transistor, a plurality of memory cells, and a plurality of dummy cells, the plurality of dummy cells being coupled in series between the select transistor and the plurality of memory cells, may include programming the plurality of dummy cells to have different threshold voltage distributions, applying a same voltage to a plurality of dummy word lines that are coupled to the plurality of dummy cells, and performing a normal program operation on the plurality of memory cells.

DETAILED DESCRIPTION

Specific advantages and features of the present invention and methods for achieving them will be made clear from embodiments described below in detail with reference to the accompanying drawings. However, they may be embodied in different forms and should not be construed as limited to the embodiments set forth herein. Rather, these embodiments are provided so that this disclosure will be thorough and complete, and will fully convey the scope of the example embodiments to those skilled in the art.

Various embodiments are directed to a memory device with a reduced chip size and an operating method thereof.

Figure 1:
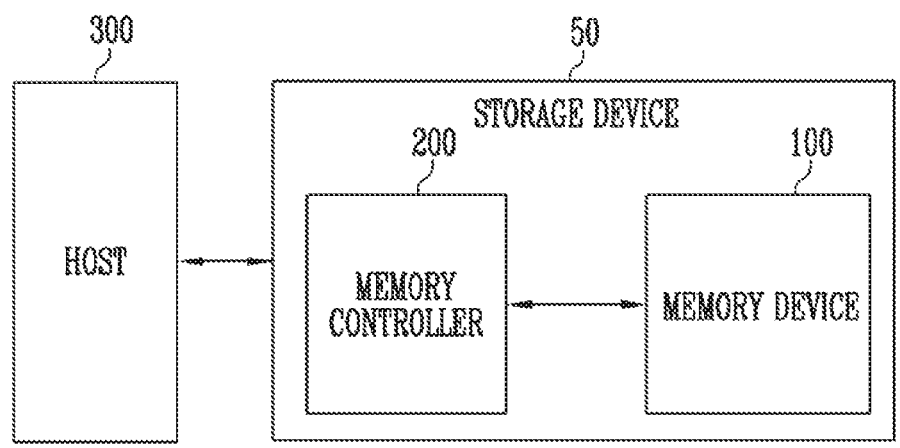
FIG. 1 is a diagram, illustrating a storage device according to an embodiment of the present disclosure.

FIG. 1 is a diagram, illustrating a storage device 50, according to an embodiment of the present disclosure.

Referring to FIG. 1, the storage device 50 may include a memory device 100 that controls operations of the memory device 100. The storage device 50 may be configured to store data in response to a host 300. Examples of the storage device 50 may include a cellular phone, a smartphone, an MP3 player, a laptop computer, a desktop computer, a game player, a TV, a tablet PC, and an in-vehicle infotainment system.

The storage device 50 may be manufactured as one of various types of storage devices based on a host (300) interface, corresponding to a communication method with the host 300. For example, the storage device 50 may be configured as any one of various kinds of storage devices such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various kinds of package types, such as a package-on-package (POP), a system-in-package (SIP), a system-on-chip (SOC), a multi-chip package (MCP), a chip-on-board (COB), a wafer-level fabricated package (WFP), and a wafer-level stack package (NSP).

The memory device 100 may store data. The memory device 100 may operate in response to the memory controller 200. The memory device 100 may include a memory cell array including a plurality of memory cells storing data.

Each of the memory cells may be a single level cell (SLC) storing one data bit, a multi-level cell (MLC) storing two data bits, a triple level cell (TLC) storing three data bits, or a quad level cell (QLC) storing four data bits.

The memory cell array may include a plurality of memory blocks. Each of the memory blocks may include a plurality of memory cells. Each memory block may include a plurality of pages. According to an embodiment, a page may be a unit for storing data in the memory device 100, or a unit for reading data stored in the memory device 100.

A memory block may be a unit for erasing data. According to an embodiment, examples of the memory device 100 may include Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR) SDRAM, Rambus Dynamic Random Access Memory (RDRAM), NAND flash memory, vertical NAND flash memory, NOR flash memory device, resistive random access memory (RRAM), phase-change memory (PRAM), magnetoresistive random access memory (MRAM), ferroelectric random access memory (FRAM), or spin transfer torque random access memory (STT-RAM). For convenience of explanation, it is assumed that the memory device 100 is a NAND flash memory.

The memory device 100 may receive a command and an address from the memory controller 200 and access an area selected in response to the address in the memory cell array. That is, the memory device 100 may perform an operation corresponding to the command on the area selected in response to the address. For example, the memory device 100 may perform a write operation (program operation), a read operation, and an erase operation. During a program operation, the memory device 100 may program the area selected by the address with data. During a read operation, the memory device 100 may read data from the area that is selected by the address. During an erase operation, the memory device 100 may erase data from the area that is selected by the address.

The memory controller 200 may control general operations of the storage device 50.

When power is applied to the storage device 50, the memory controller 200 may execute firmware FW. When the memory device 100 is a flash memory device, the memory controller 200 may execute firmware such as a Flash Translation Layer (FTL) for controlling communication between the host 300 and the memory device 100.

According to an embodiment, the memory controller 200 may receive data and a logical block address LBA from the host 300 and convert the logical block address LBA into a physical block address PBA indicating an address of memory cells in which the data is stored that is included in the memory device 100.

The memory controller 200 may control the memory device 100 so that a program operation, a read operation, or an erase operation may be performed in response to a request from the host 300. During a program operation, the memory controller 200 may provide a write command, a physical block address, and data to the memory device 100. During a read operation, the memory controller 200 may provide a read command and a physical block address to the memory device 100. During an erase operation, the memory controller 200 may provide an erase command, a physical block address, and data to the memory device 100.

According to an embodiment, the memory controller 200 may generate and transfer a program command, an address, and data to the memory device 100, regardless of a request from the host 300. For example, the memory controller 200 may provide a command, an address, and data to the memory device 100 to perform background operations, such as a program operation for wear leveling and a program operation for garbage collection.

According to an embodiment, the memory controller 200 may control at least two memory devices 100. The memory controller 200 may control the memory devices 100 based on an interleaving scheme so as to improve operation performance. The interleaving scheme may refer to an operating scheme for overlapping an operating period between at least two memory devices 100.

The host 300 may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
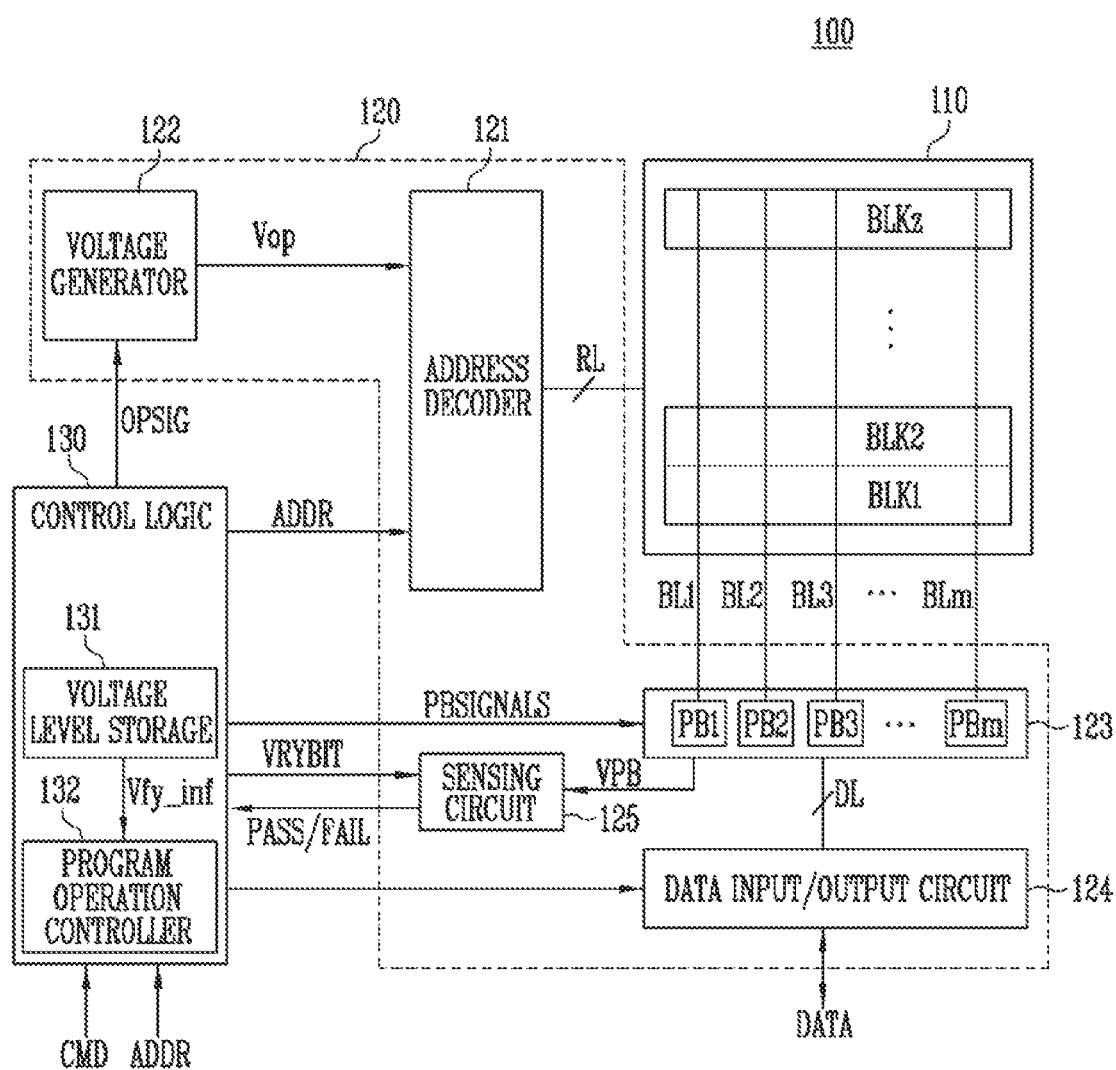
FIG. 2 is a diagram, illustrating the structure of a memory device of FIG.

FIG. 2 is a diagram, illustrating the structure of the memory device 100 of FIG. 1.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz may be coupled to an address decoder 121 through row lines RL. The memory blocks BLK1 to BLKz may be coupled to a read and write circuit 123 through bit lines BL1 to BLm. Each of the plurality of memory blocks BLK1 to BLKz may include a plurality of memory cells. In an embodiment, the plurality of memory cells may be nonvolatile memory cells. Among the plurality of memory cells, memory cells that are coupled to the same word line may be defined as one page. In other words, the memory cell array 110 may include a plurality of pages. According to an embodiment, each of the plurality of memory blocks BLK1 to BLKz that is included in the memory cell array 110 may include a plurality of dummy cells. One or more dummy cells may be coupled in series between a drain select transistor and memory cells and between a source select transistor and memory cells.

The memory cells of the memory device 100 may include a single level cell (SLC) that stores a single data bit, a multi level cell (MLC) that stores two data bits, a triple level cell (TLC) that stores three data bits, and a quad level cell (QLC) that stores four data bits.

The peripheral circuit 120 may include the address decoder 121, a voltage generator 122, the read and write circuit 123, a data input/output circuit 124, and a sensing circuit 125.

The peripheral circuit 120 may be configured to drive the memory cell array 110. For example, the peripheral circuit 120 may drive the memory cell array 110 to perform a program operation, a read operation, and an erase operation.

The address decoder 121 may be coupled to the memory cell array 110 through the row lines RL. The row lines RL may include drain select lines, word lines, source select lines, and a common source line. According to an embodiment of the present disclosure, the word lines may include normal word lines and dummy word lines. According to an embodiment, the row lines RL may further include a pipe select line.

The address decoder 121 may be configured to operate in response to the control logic 130. The address decoder 121 may receive an address ADDR from the control logic 130.

The address decoder 121 may be configured to decode a block address of the received address ADDR. The address decoder 121 may select at least one memory block among the memory blocks BLK1 to BLKz based on the decoded block address. The address decoder 121 may be configured to decode the row address from the received address ADDR. The address decoder 121 may select at least one word line among a plurality of word lines of the selected memory block based on the decoded row address. The address decoder 121 may apply an operating voltage Vop that is supplied from the voltage generator 122 to the selected word line.

During a program operation, the address decoder 121 may apply a program voltage to the selected word line and a pass voltage with a lower voltage level than the program voltage to unselected word lines. During a program verify operation, the address decoder 121 may apply a verify voltage to the selected word line and a verify pass voltage greater than the verify voltage to the unselected word lines.

During a read operation, the address decoder 121 may apply a read voltage to the selected word line and a pass voltage with a lower voltage level than the read voltage to the unselected word lines.

According to an embodiment of the present disclosure, the memory device 100 may perform an erase operation on each memory block. During the erase operation, the address ADDR input to the memory device 100 may include a block address. The address decoder 121 may decode the block address and select one of the memory blocks based on the decoded block address. During the erase operation, the address decoder 121 may apply a ground voltage to word lines coupled to the selected memory block.

According to an embodiment, the address decoder 121 may be configured to decode a column address of the transferred address ADDR. The decoded column address may be transferred to the read and write circuit 123. For example, the address decoder 121 may include components, such as a row decoder, a column decoder and an address buffer.

The voltage generator 122 may be configured to generate a plurality of operating voltages Vop by using an external power voltage supplied to the memory device 100. The voltage generator 122 may be controlled by the control logic 130.

According to an embodiment, the voltage generator 122 may generate an internal power voltage by regulating an external power voltage. The internal power voltage that is generated by the voltage generator 122 may serve as an operating voltage for the memory device 100.

According to an embodiment, the voltage generator 122 may generate the plurality of operating voltages Vop by using the external power voltage or the internal power voltage. The voltage generator 122 may be configured to generate various voltages required by the memory device 100. For example, the voltage generator 122 may generate a plurality of erase voltages, a plurality of program voltages, a plurality of dummy pass voltages, a plurality of selected read voltages, and a plurality of unselected read voltages.

The voltage generator 122 may include a plurality of pumping capacitors that receive the internal power voltage so as to generate the plurality of operating voltages Vop with various voltage levels. The voltage generator 122 may generate the plurality of operating voltages Vop by selectively activating the plurality of pumping capacitors in response to the control logic 130.

The plurality of generated operating voltages Vop may be supplied to the memory cell array 110 by the address decoder 121.

The read and write circuit 123 may include first to mth page buffers PB1 to PBm. The first to mth page buffers PB1 to PBm may be coupled to the memory cell array 110 through the first to mth bit lines BL1 to BLm, respectively. The first to mth page buffers PB1 to PBm may operate in response to the control logic 130.

The first to mth page buffers PB1 to PBm may communicate data DATA with the data input/output circuit 124. During a program operation, the first to mth page buffers PB1 to PBm may receive the data DATA to be stored through the data input/output circuit 124 and data lines DL.

During a program operation, when a program voltage is applied to the selected word line, the first to mth page buffers PB1 to PBm may transfer the data DATA received through the data input/output circuit 124 to the selected memory cells through the bit lines BL1 to BLm. The memory cells of the selected page may be programmed based on the transferred data DATA. A memory cell that is coupled to a bit line to which a program permission voltage (e.g., a ground voltage) is applied may have an increased threshold voltage. On the other hand, a threshold voltage of a memory cell that is coupled to a bit line to which a program inhibition voltage (for example, a power voltage) is applied may be maintained. During a program verify operation, the first to mth page buffers PB1 to PBm may read the data DATA that is stored in the memory cells through the bit lines BL1 to BLm from the selected memory cells.

During a read operation, the read and write circuit 123 may read the data DATA from the memory cells of the selected page through the bit lines BL and output the read data DATA to the data input/output circuit 124.

During an erase operation, the read and write circuit 123 may float the bit lines BL1 to BLm. According to an embodiment, the read and write circuit 123 may include a column selection circuit.

The data input/output circuit 124 may be coupled to the first to mth page buffers PB1 to PBm through the data lines DL. The data input/output circuit 124 may operate in response to the control of the control logic 130.

The data input/output circuit 124 may include a plurality of input/output buffers (not shown) receiving the input data DATA. During a program operation, the data input/output circuit 124 may receive the data DATA to be stored from an external controller (not shown). During a read operation, the data input/output circuit 124 may output the data DATA that is transferred from the first to mth page buffers PB1 to PBm that are included in the read and write circuit 123 to the external controller.

The sensing circuit 125 may generate a reference current in response to an allowable bit VRYBIT signal generated by the control logic 130 and may compare a sensing voltage VPB that is received from the read and write circuit 123 with a reference voltage that is generated by the reference current to output a pass signal or a fail signal during a read operation or a verify operation.

The control logic 130 may be coupled to the address decoder 121, the voltage generator 122, the read and write circuit 123, the data input/output circuit 124, and the sensing circuit 125. The control logic 130 may be configured to control the general operations of the memory device 100. The control logic 130 may operate in response to a command CMD transferred from an external device.

The control logic 130 may control the peripheral circuit 120 by generating various signals in response to the command CMD and the address ADDR. For example, the control logic 130 may output an operating signal OPSIG, the address ADDR, read and write control signals PBSIGNALS, and the allowable bit VRYBIT in response to the command CMD and the address ADDR. The control logic 130 may output the operating signal OPSIG to the voltage generator 122, output the address ADDR to the address decoder 121, output a read and write control signal to the read and write circuit 123, and may output the allowable bit VRYBIT to the sensing circuit 125. In addition, the control logic 130 may determine whether a verify operation passes or fails in response to the pass or fail signal (PASS/FAIL) output by the sensing circuit 125.

According to an embodiment, the control logic 130 may include a voltage level storage 131 and a program operation controller 132.

According to an embodiment, the voltage level storage 131 may include information Vfy_inf on levels of dummy program verify voltages to be applied to a plurality of dummy cells when a program verify operation is performed on the plurality of dummy cells. The plurality of dummy cells may be coupled in series between a select transistor and a plurality of memory cells.

More specifically, information about levels of dummy program verify voltages may include level information about a program verify voltage to be applied to each of the plurality of dummy word lines coupled to the plurality of dummy cells. According to an embodiment, the level of the dummy program verify voltage to be applied to each of the dummy word lines may vary based on each dummy word line. According to an embodiment, voltage levels of dummy program verify voltages applied to at least two dummy word lines, among the plurality of dummy word lines, may be the same as each other.

According to an embodiment, the program operation controller 132 may control the peripheral circuit 120 to perform a program operation and a program verify operation on the plurality of dummy cells on the basis of the information Vfy_inf on the voltage levels of the dummy program verify voltages that are received from the voltage level storage 131. According to an embodiment, the program operation controller 132 may control the peripheral circuit 120 so that a plurality of dummy cells that are coupled to a plurality of dummy word lines may have different threshold voltage distributions based on the locations of the plurality of dummy word lines. According to an embodiment, the program operation controller 132 may control the peripheral circuit 120 to apply a dummy program verify voltage with a lower level to a dummy word line that is closer to the plurality of memory cells as opposed to the select transistor during a program verify operation. According to an embodiment, the program operation controller 132 may control the peripheral circuit 120 to apply the dummy program verify voltage with a higher voltage level to a dummy word line that is further away from the plurality of memory cells as opposed to the select transistor during a program verify operation. According to an embodiment, the program operation controller 132 may control the peripheral circuit 120 to apply dummy program verify voltages with the same voltage level to adjacent dummy word lines during a program verify operation.

Figure 3:
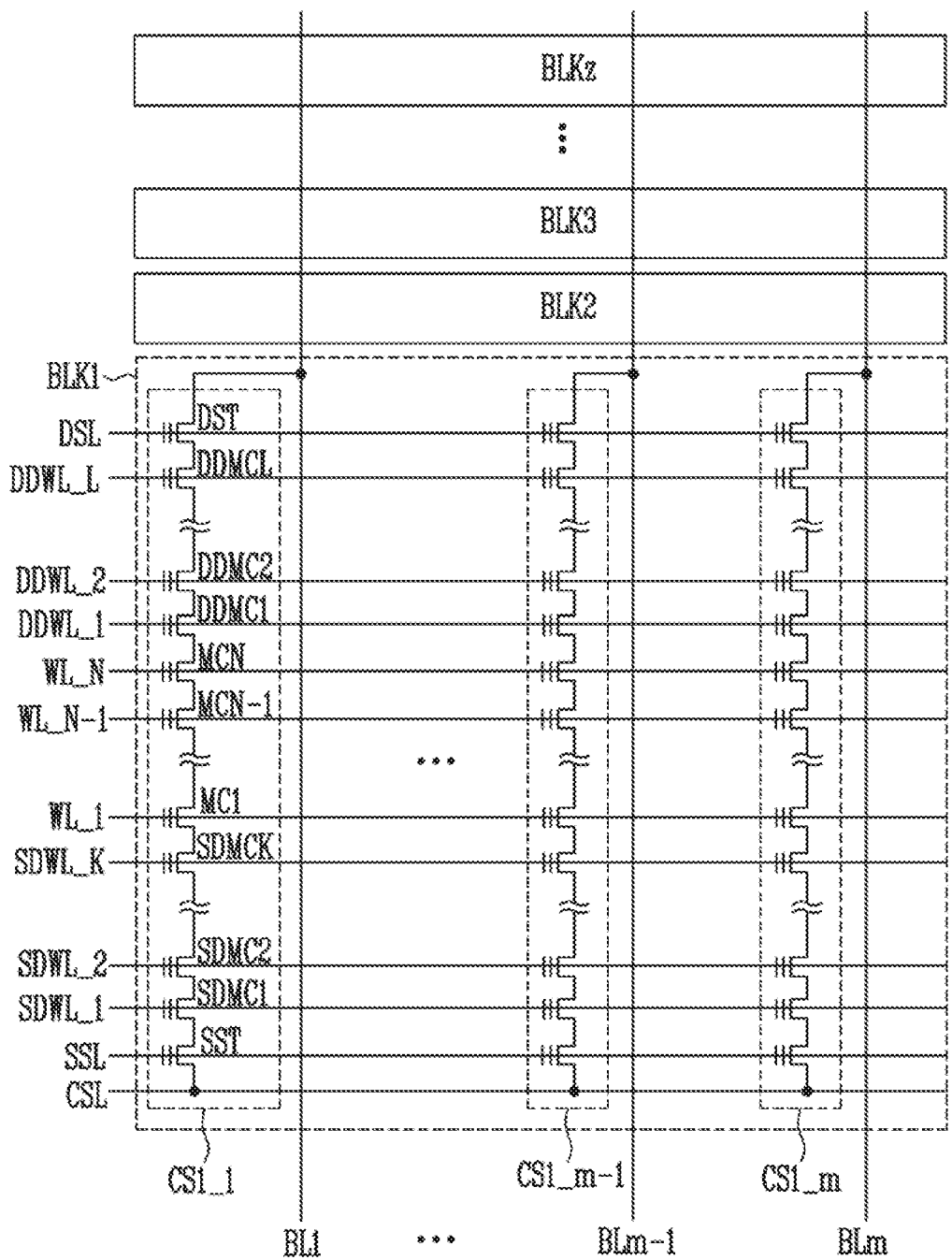
FIG. 3 is a diagram, illustrating a memory cell array of FIG. 2.

FIG. 3 is a diagram, illustrating the structure of the memory cell array 110 of FIG. 2.

Referring to FIG. 3, the first to zth memory blocks BLK1 to BLKz may be commonly coupled to the first to mth bit lines BL1 to BLm. In FIG. 3, for convenience of explanation, components that are included in the first memory block BLK1, among the plurality of memory blocks BLK1 to BLKz, are illustrated, whereas components that are included in the memory blocks BLK2 to BLKz are omitted. Each of the remaining memory blocks BLK2 to BLKz may be configured in substantially the same manner as the first memory block BLK1.

The first memory block BLK1 may include a plurality of cell strings CS1_1 to CS1_m, where m is a positive integer. Each of first to mth cell strings CS1_1 to CS1_m may be coupled to the first to mth bit lines BL1 to BLm, respectively. The first to mth cell strings CS1_1 to CS1_m may include a drain select transistor DST, a plurality of drain dummy cells DDMC1 to DDMCL coupled in series, where L is a positive integer, a plurality of memory cells MC1 to MCN coupled in series, where N is a positive integer, a plurality of source dummy cells SDMC1 to SDMCK coupled in series, where K is a positive integer, and a source select transistor SST.

A gate terminal of the drain select transistor DST that is included in each of the first to mth cell strings CS1_1 to CS1_m may be coupled to a drain select line DSL. Gate terminals of the first to Lth drain dummy cells DDMC1 to DDMCL that are included in the first to mth cell strings CS1_1 to CS1_m may be coupled to first to Lth drain dummy word lines DDWL_1 to DDWL_L, respectively. Gate terminals of the first to Nth dummy cells MC1 to MCN that are included in each of the first to mth cell strings CS1_1 to CS1_m may be coupled to first to Nth normal word lines WL_1 to WL_N, respectively. Gate terminals of the first to Kth source dummy cells SDMC1 to SDMCK that are included in each of the first to mth cell strings CS1_1 to CS1_m may be coupled to first to Kth source dummy word lines SDWL_1 to SDWL_K, respectively, and a gate terminal of the source select transistor SST that is included in each of the first to mth cell strings CS1_1 to CS1_m may be coupled to a source select line SSL.

For convenience of explanation, the structure of a cell string is described on the basis of the first cell string CS1_1 among the plurality of cell strings CS1_1 to CS1_m. However, each of the cell strings CS1_2 to CS1_m may also be configured in the same manner as the first cell string CS1_1.

A drain terminal of the drain select transistor DST that is included in the first cell string CS1_1 may be coupled to the first bit line BL1. A source terminal of the drain select transistor DST that is included in the first cell string CS1_1 may be coupled to a drain terminal of the Lth drain dummy cell DDMCL that is included in the first cell string CS1_1. The first to Lth drain dummy cells DDMC1 to DDMCL may be coupled in series with each other, and the first to Nth memory cells MC1 to MCN may be coupled in series with each other. In addition, the first to Kth source dummy cells SDMC1 to SDMCK may be coupled in series with each other, the first drain dummy cell DDMC1 and the Nth memory cell MCN may be coupled in series with each other, and the first memory cell MC1 may be coupled in series with the Kth source dummy cell SDMCK. A drain terminal of the source select transistor SST that is included in the first cell string CS1_1 may be coupled to a source terminal of the first source dummy cell SDMC1 that is included in the first cell string CS1_1. A source terminal of the source select transistor SST that is included in the first cell string CS1_1 may be coupled to a common source line CSL. According to an embodiment, the common source line CSL may be commonly connected to the first to zth memory blocks BLK1 to BLKz.

The drain select line DSL, the first to Lth drain dummy word lines DDWL_1 to DDWL_L, the first to Nth normal word lines WL_1 to WL_N, the first to Kth source dummy word lines SDWL_1 to SDWL_K and the source select line SSL may be included in the row lines RL as shown in FIG. 2. The drain select line DSL, the first to Lth drain dummy word lines DDWL_1 to DDWL_L, the first to Nth normal word lines WL_1 to WL_N, the first to Kth source dummy word lines SDWL_1 to SDWL_K, and the source select line SSL may be controlled by the address decoder 121. The common source line CSL may be controlled by the control logic 130. The first to mth bit lines BL1 to BLm may be controlled by the read and write circuit 123.

Figure 4:
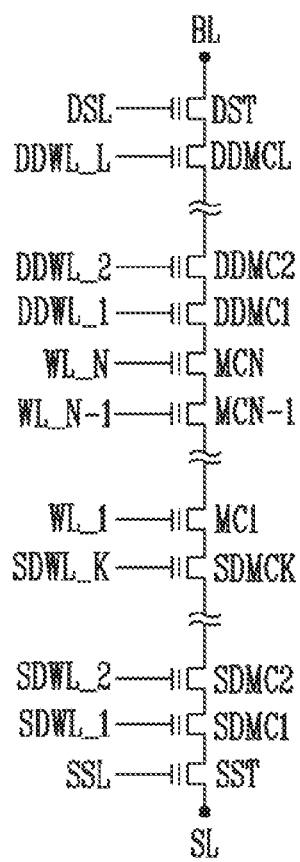
FIG. 4 is a diagram, illustrating a cell string of FIG. 3, according to an embodiment of the present disclosure.

FIG. 4 is a diagram, illustrating a cell string of FIG. 3, according to an embodiment of the present disclosure.

FIG. 4 illustrates the structure of one of the cell strings CS1_1 to CS1_m as described with reference to FIG. 3. Each of the cell strings may include the source select transistor SST, the plurality of source dummy cells SDMC1 to SDMCK, the plurality of memory cells MC1 to MCN, the plurality of drain dummy cells DDMC1 to DDMCL, and the drain select transistor DST.

However, the number of drain select transistors and the number of source select transistors that are included in a single cell string are not limited to this embodiment. In various embodiments, for example, one cell string may include either drain dummy cells or source dummy cells.

As shown in FIG. 4, the drain select line DSL may be coupled to the drain select transistor DST. The plurality of drain dummy word lines DDWL_1 to DDWL_L may be coupled to the plurality of drain dummy cells DDMC1 to DDMCL. The plurality of normal word lines WL_1 to WL_N may be coupled to the plurality of memory cells MC1 to MCN. The plurality of source dummy word lines SDWL_1 to SDWL_K may be coupled to the plurality of source dummy cells SDMC1 to SDMCK. The source select line SSL may be coupled to the source select transistor SST.

According to an embodiment, the plurality of drain dummy cells DDMC1 to DDMCL and the plurality of source dummy cells SDMC1 to SDMCK may be provided so as to stably control a voltage or current of the corresponding cell string. For example, the plurality of source dummy cells SDMC1 to SDMCK may serve as a buffer that reduces the difference in channel potential between the source select transistor SST and the plurality of memory cells MC1 to MCN. The plurality of drain dummy cells DDMC1 to DDMCL may serve as a buffer that reduces the difference in channel potential between the drain select transistor DST and the plurality of memory cells MC1 to MCN.

According to an embodiment, after an erase operation on an arbitrary memory block, a dummy program operation may be performed so that the plurality of drain dummy cells DDMC1 to DDMCL and the plurality of source dummy cells SDMC1 to SDMCK may have target threshold voltages.

For convenience of explanation, a dummy program operation on the plurality of drain dummy cells DDMC1 to DDMCL is described below as an example. A dummy program operation on the plurality of source dummy cells may be described in the same manner as described for the dummy program operation on the plurality of drain dummy cells DDMC1 to DDMCL.

According to an embodiment, the plurality of drain dummy cells DDMC1 to DDMCL may be programmed to have different threshold voltages. More specifically, different dummy program verify voltages may be applied to the plurality of drain dummy word lines DDWL_1 to DDWL_L during a dummy program verify operation so that the plurality of drain dummy cells DDMC1 to DDMCL may have different threshold voltages. The voltage level of the dummy program verify voltage may vary based on the location of each dummy word line. According to various embodiments, a dummy program verify voltage with the same level may be applied to at least two adjacent drain dummy word lines.

For example, a lower dummy program verify voltage may be applied to a drain dummy word line that is closer to the plurality of memory cells MC1 to MCN as opposed to the drain select transistor DST. More specifically, a lower dummy program verify voltage may be applied to the first drain dummy word line DDWL_1 closer to the plurality of memory cells MC1 to MCN than the Lth drain dummy word line DDWL_L.

According to an embodiment, after the dummy program operation is performed, a normal program operation on the plurality of memory cells MC1 to MCN may be performed. According to an embodiment, during a normal program operation, dummy word line voltages with the same voltage level may be applied to the plurality of drain dummy word lines DDWL_1 to DDWL_L. During the normal program operation, dummy word line voltages with the same voltage level may be applied to the plurality of source dummy word lines SDWL_1 to SDWL_K.

Figure 5:
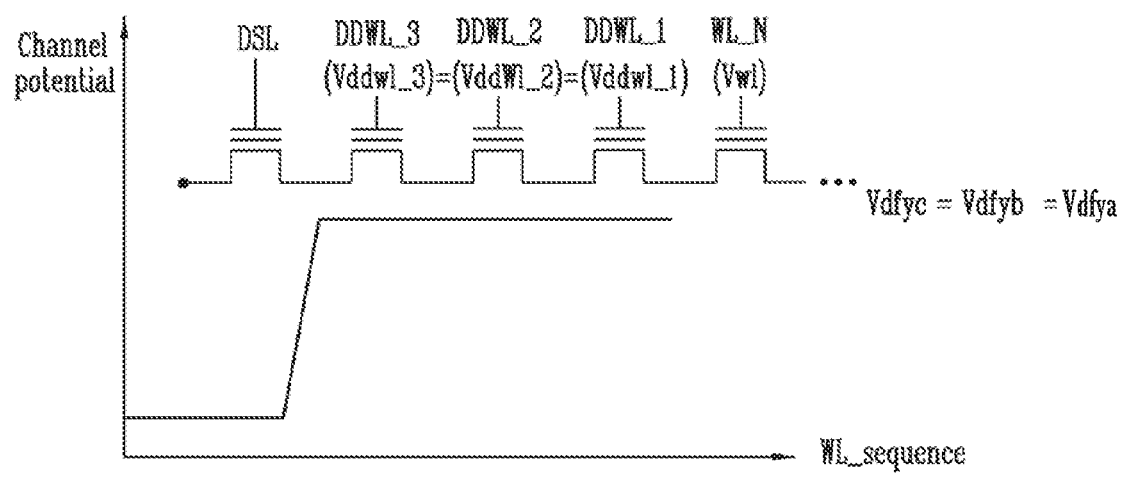
FIG. 5 is diagram, illustrating a channel potential of a cell string based on the locations of word lines during a program operation, according to an embodiment of the present invention.

FIG. 5 is diagram, illustrating a channel potential of a cell string based on the locations of word lines during a program operation, according to an embodiment of the present invention.

Referring to FIG. 5, a horizontal axis represents the order of a select line and a word line, and a vertical axis represents a channel potential of a cell string. The channel potential may be determined based on a difference between a voltage applied to each word line and threshold voltages of memory cells that are coupled to each word line.

In FIG. 5, it is assumed that a cell string includes first, second and third drain dummy cells. However, the number of drain dummy cells that are included in the cell string is not limited to this embodiment. The first drain dummy cell may be coupled to the first drain dummy word line DDWL_1. The second drain dummy cell may be coupled to the second drain dummy word line DDWL_2. The third drain dummy cell may be coupled to the third drain dummy word line DDWL_3.

The first to third drain dummy cells may be programmed to have the same threshold voltage. For example, a threshold voltage Vdfya of the first drain dummy cell, a threshold voltage Vdfyb of the second drain dummy cell, and a threshold voltage Vdfyc of the third drain dummy cell may be the same as each other.

According to an embodiment, during a normal program operation on a plurality of memory cells, a program pulse voltage may be applied to a selected word line among a plurality of normal word lines coupled to the plurality of memory cells. A pass voltage may be applied to an unselected word line among the plurality of normal dummy word lines. The same dummy word line voltage may be applied to the plurality of word lines DDWL_1 to DDWL_3.

More specifically, during a normal program operation, a first dummy word line voltage Vddwl_1 may be applied to the first drain dummy word line DDWL_1. A second dummy word line voltage Vddwl_2 may be applied to the second drain dummy word line DDWL_2. A third dummy word line voltage Vddwl_3 may be applied to the third drain dummy word line DDWL_3. The plurality of dummy word line voltage Vddwl_1 to Vddwl_3 may have the same magnitude. In addition, the first to third drain dummy cells may have the same channel potential.

As a result, a drastic potential difference may occur between a channel of the third drain dummy cell and a channel of the drain select transistor, and an adjacent word line may be disturbed by hot carrier injection (HCI).

Figure 6:
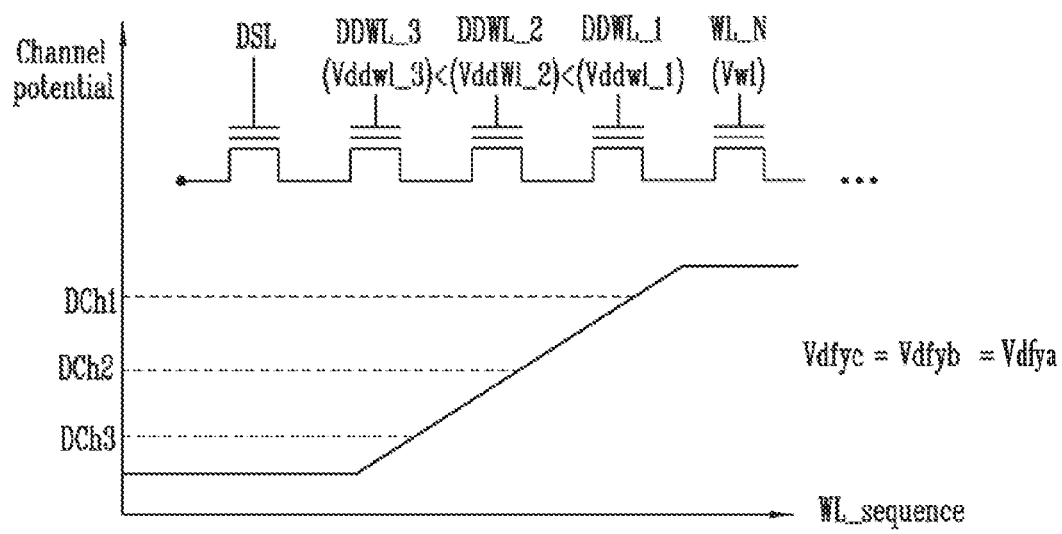
FIG. 6 is diagram, illustrating a channel potential of a cell string based on the locations of word lines during a program operation, according to an embodiment of the present invention.

FIG. 6 is diagram, illustrating a channel potential of a cell string based on the locations of word lines during a program operation, according to an embodiment of the present invention.

Referring to FIG. 6, the structure of a cell string may be the same as the structure of the cell string as described above with reference to FIG. 5. In FIG. 6, the threshold voltages Vdfya, Vdfyb and Vdfyc of the first, second and third drain dummy cells may have the same magnitude. During a normal program operation, dummy word line voltages with different magnitudes may be applied to the first to third drain dummy word lines DDWL_1 to DDWL_3, respectively.

More specifically, during a normal program operation, a dummy word line voltage with the lowest voltage level may be applied to a drain dummy word line that is the closest to the drain select line DSL, A dummy word line voltage with a higher voltage level may be applied to a drain dummy word line that is closer to the normal word line as opposed to the drain select line DSL. In other words, the magnitudes of the dummy word line voltages that are applied to the dummy word lines may decrease in a direction from the first drain dummy word line DDWL_1 toward the third drain dummy word line DDWL_3. For example, the third dummy word line voltage Vddwl_3 may be less than the second dummy word line voltage Vddwl_2. The second dummy word line voltage Vddwl_2 may be less than the first dummy word line voltage Vddwl_1.

Therefore, although the first to third drain dummy cells have the same threshold voltage, dummy word line voltages with different magnitudes may be applied thereto. Therefore, a channel potential with a gentle slope may be formed during the normal program operation.

However, for example, the magnitudes of the dummy word line voltages applied to the dummy word lines may decrease in a direction from the first drain dummy word line DDWL_1 toward the third drain dummy word line DDWL_3. Therefore, channel potentials DCh1 to DCh3 of the first to third dummy cells may be gently reduced.

Therefore, the HCI disturbance caused by the drastic channel potential difference as described with reference to FIG. 5 may be prevented. However, a chip size may be increased due to a separate voltage generator that is added to apply dummy word line voltages with different levels to the respective drain dummy word lines.

Figure 7:
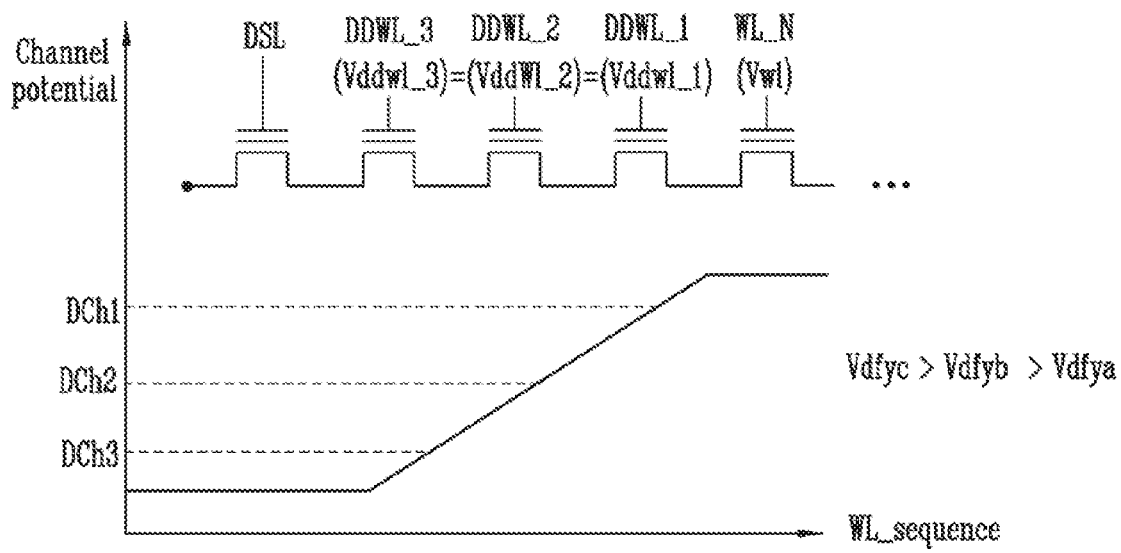
FIG. 7 is diagram, illustrating a channel potential of a cell string based on the locations of word lines during a program operation, according to an embodiment of the present invention.

FIG. 7 is diagram, illustrating a channel potential of a cell string based on the locations of word lines during a program operation, according to an embodiment of the present invention.

Referring to FIG. 7, the structure of a cell string may be the same as the structure of the cell string as described above with reference to FIG. 5. In FIG. 7, the threshold voltages Vdfya, Vdfyb and Vdfyc of the first, second and third drain dummy cells may have different magnitudes. During a normal program operation, the dummy word line voltages Vddwl_1 to Vddwl_3 applied to the first to third drain dummy word lines DDWL_1 to DDWL_3 may have the same magnitude.

According to an embodiment, a dummy program operation may be performed so that the first to third drain dummy cells may have different threshold voltages based on the locations of the first to third drain dummy cells.

For example, a dummy program operation may be performed so that the third drain dummy cell that is the closest to the drain select transistor coupled to the drain select line DSL may have the largest threshold voltage among the first to third drain dummy cells. A dummy program operation may be performed so that the first drain dummy cell that is the closest to the memory cell that is coupled to the Nth normal word line WL_N may have the smallest threshold voltage among the first to third drain dummy cells. A dummy program operation may be performed so that the second drain dummy cell may have a threshold voltage between the threshold voltage of the first drain dummy cell and the threshold voltage of the third drain dummy cell.

Therefore, the threshold voltage Vdfya of the first drain dummy cell may be less than the threshold voltage Vdfyb of the second drain dummy cell, and the threshold voltage Vdfyb of the second drain dummy cell may be less than the threshold voltage Vdfyc of the third drain dummy cell.

Therefore, during a normal program operation, although the same dummy word line voltage is applied to the first to third drain dummy cells, the first to third drain dummy cells may have different threshold voltages. Therefore, a channel potential with a gentle slope may be formed during the normal program operation.

For example, since the threshold voltage of the drain dummy cells may increase in magnitude in a direction from the first drain dummy cell toward the third drain dummy cell, the channel potentials DCh1 to DCh3 of the first to third drain dummy cells may be gently reduced.

Therefore, the HCI disturbance caused by the drastic channel potential difference as described with reference to FIG. 5 may be improved. Since the dummy word line voltage with the same voltage level is applied to each drain dummy word line, contrary to the description made above with reference to FIG. 6, the addition of a separate voltage generator for applying dummy word line voltages with different voltage levels may be unnecessary, and a chip size may be reduced.

Figure 8:
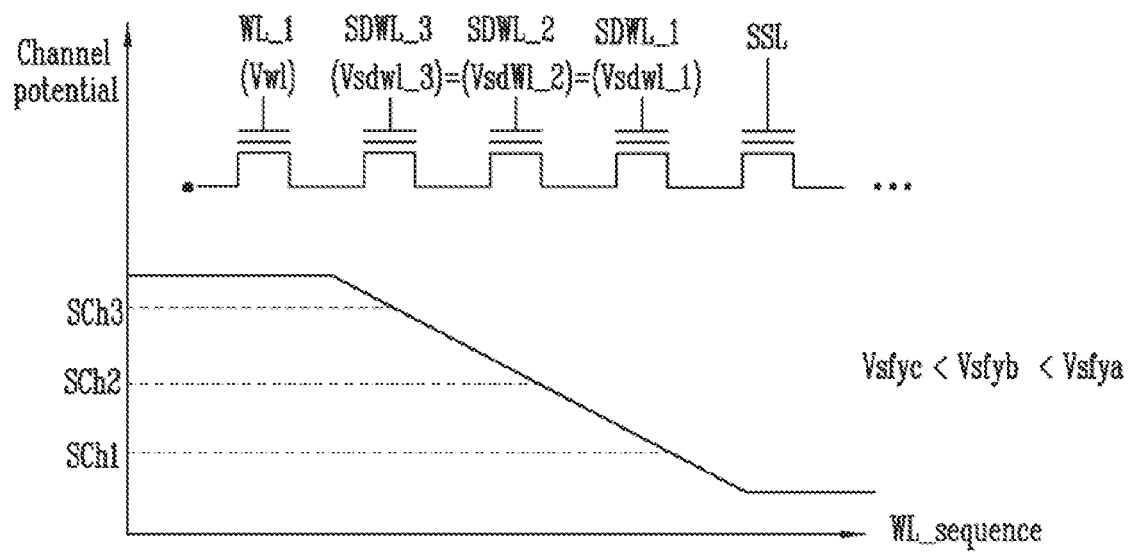
FIG. 8 is diagram, illustrating a channel potential of a cell string based on the locations of word lines during a program operation, according to an embodiment of the present invention.

FIG. 8 is diagram, illustrating a channel potential of a cell string based on the locations of word lines during a program operation, according to an embodiment of the present invention.

Referring to FIG. 8, a horizontal axis represents the order of a select line and a word line, and a vertical axis represents a channel potential of a cell string. The channel potential may be determined based on a difference between a voltage applied to each word line and threshold voltages of memory cells that are coupled to each word line.

In FIG. 8, it is assumed that a cell string includes first, second and third source dummy cells. However, the number of source dummy cells that are included in the cell string is not limited to this embodiment. The first source dummy cell may be coupled to the first source dummy word line SDWL_1. The second source dummy cell may be coupled to a second source dummy word line SDWL_2. The third source dummy cell may be coupled to a third source dummy word line SDWL_3.

In FIG. 8, the threshold voltages Vdfya, Vdfyb and Vdfyc of the first, second and third source dummy cells may have different magnitudes. During a normal program operation, dummy word line voltages Vsdwl_1 to Vsdwl_3 applied to the first to third source dummy word lines SDWL_1 to SDWL_3 may have the same magnitude.

According to an embodiment, a dummy program operation may be performed so that the first to third source dummy cells may have different threshold voltages based on the locations of the first to third source dummy cells.

For example, a dummy program operation may be performed so that the first source dummy cell that is the closest to the source select transistor coupled to the source select line SSL may have the highest threshold voltage among the first to third source dummy cells. A dummy program operation may be performed so that the third source dummy cell that is the closest to the memory cell that is coupled to the first normal word line WL_1 may have the lowest threshold voltage among the first to third source dummy cells. A dummy program operation may be performed so that the second source dummy cell may have the threshold voltage Vdfyb between the threshold voltage Vdfya of the first source dummy cell and the threshold voltage Vdfyc of the third source dummy cell.

Therefore, the threshold voltage Vdfya of the first source dummy cell may be greater than the threshold voltage Vdfyb of the second source dummy cell, and the threshold voltage Vdfyb of the second source dummy cell may be greater than the threshold voltage Vdfyc of the third source dummy cell.

Therefore, during a normal program operation, although the same dummy word line voltage is applied to the first to third source dummy cells, the first to third source dummy cells may have different threshold voltages. Therefore, a channel potential with a gentle slope may be formed during the normal program operation.

For example, since magnitudes of threshold voltages of source dummy cells may decrease in a direction from the first source dummy cell toward the third source dummy cell, channel potentials SCh1 to SCh3 of the first to third source dummy cells may be gently increased.

As a result, the HCI disturbance caused by the drastic channel potential difference may be improved. Since the dummy word line voltage with the same level is applied to each source dummy word line, the addition of a separate voltage generator for applying dummy word line voltages with different voltage levels may be unnecessary, and a chip size may be reduced.

Figure 9:
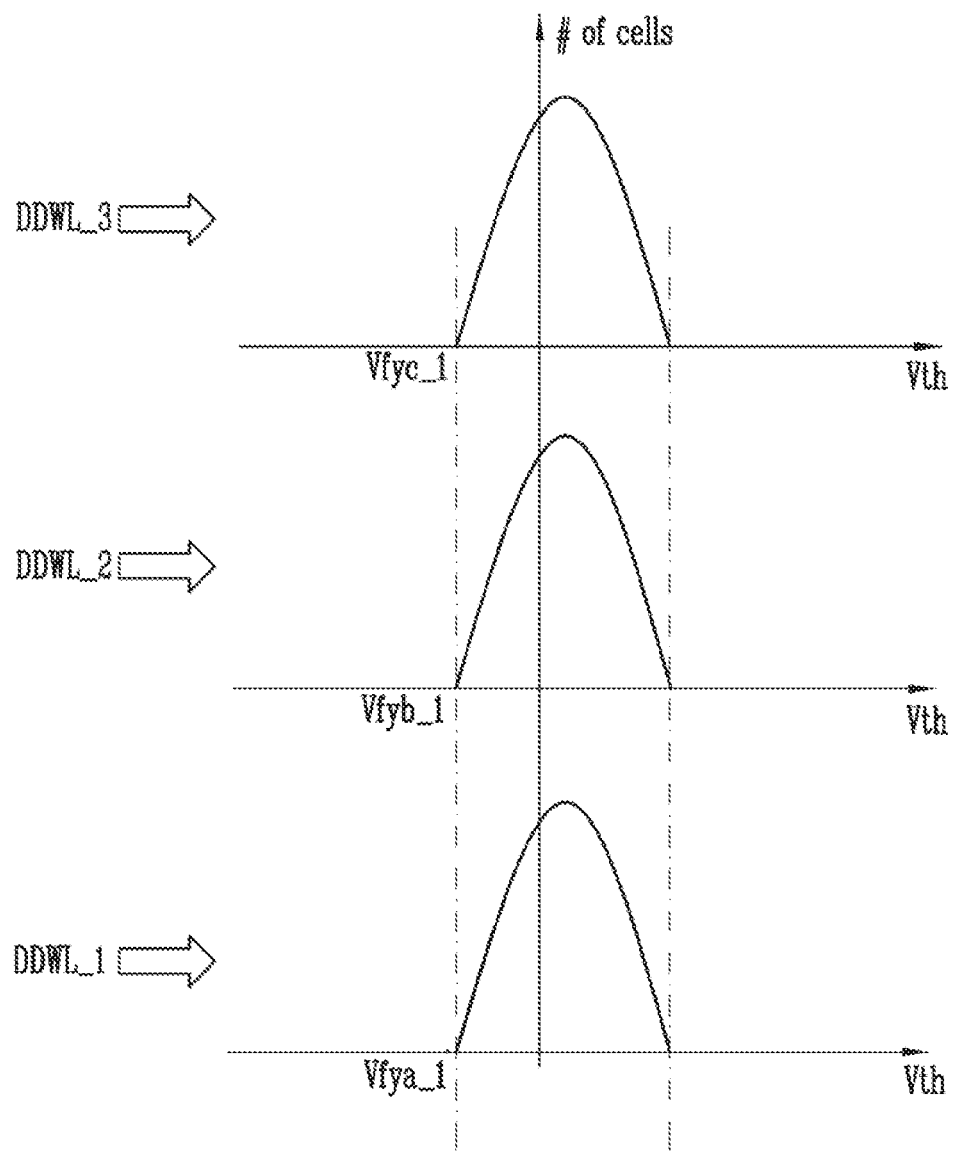
FIG. 9 is a diagram, illustrating threshold voltage distributions of dummy cells based on the locations of dummy word lines, according to an embodiment of the present disclosure.

FIG. 9 is a diagram, illustrating threshold voltage distributions of dummy cells based on the locations of dummy word lines, according to an embodiment of the present disclosure.

Referring to FIG. 9, threshold voltage distributions of the dummy cells that are coupled to the first to third drain dummy word lines DDWL_1 to DDWL_3 are shown.

As shown in FIG. 9, a dummy program operation may be performed so that the drain dummy cells that are coupled to the plurality of drain dummy word lines DDWL_1 to DDWL_3 may have the same threshold voltage distribution. For example, before a normal program operation is performed on a plurality of memory cells, a dummy program operation may be performed so that threshold voltages Vfya_1, Vfyb_1, and Vfyc_1 of the first to third drain dummy cells may be the same.

For example, by performing a dummy program operation, the threshold voltages Vfya_1 to Vfyc_1 of the first to third drain dummy cells may be –0.5 V. During a normal program operation, a voltage of 3 V may be applied to the third drain dummy word line DDWL_3, a voltage of 6 V may be applied to the second drain dummy word line DDWL_2, and a voltage of 7 V may be applied to the first drain dummy word line DDWL_1. A channel potential of approximately 6 V to 7.5 V may be formed in the first drain dummy cell on the basis of the difference between the first dummy word line voltage and the threshold voltage Vfya_1 of the first drain dummy cell. Similarly, a channel potential of approximately 5 V to 6.5 V may be formed in the second drain dummy cell on the basis of the difference between the second dummy word line voltage and the threshold voltage Vfyb_1 of the second drain dummy cell. Lastly, a channel potential of approximately 2 V to 3.5 V may be formed in the third drain dummy cell on the basis of the difference between the third dummy word line voltage and the threshold voltage Vfyc_1 of the third drain dummy cell.

The threshold voltage distributions of the drain dummy cells are described with reference to FIG. 9. However, threshold voltage distributions of source dummy cells may be described in the same manner as above.

Figure 10:
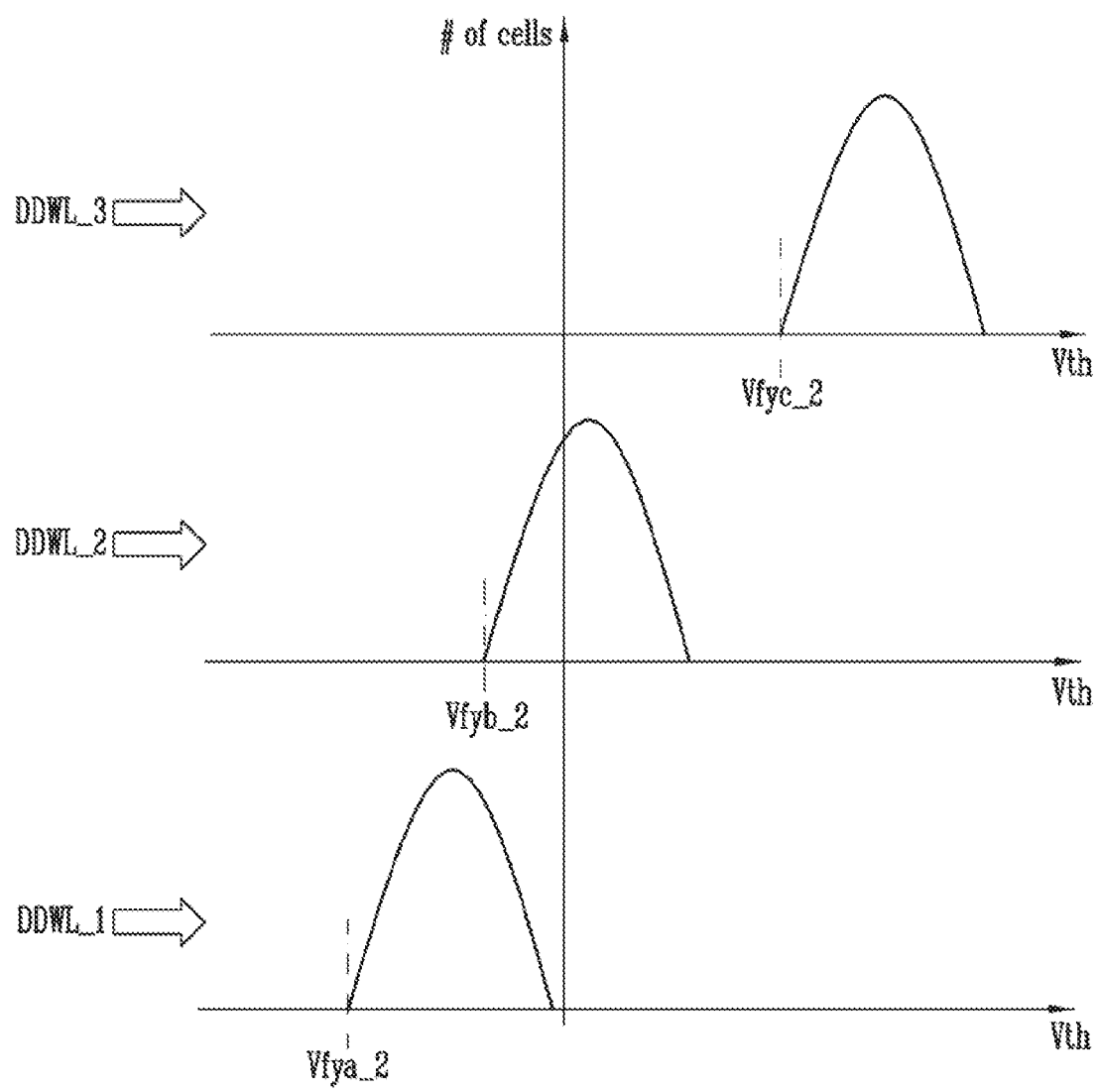
FIG. 10 is a diagram, illustrating threshold voltage distributions of dummy cells based on the locations of dummy word lines, according to an embodiment of the present disclosure.

FIG. 10 is a diagram, illustrating threshold voltage distributions of dummy cells based on the locations of dummy word lines, according to an embodiment of the present disclosure.

Referring to FIG. 10, threshold voltage distributions of the drain dummy cells that are coupled to the first to third drain dummy word lines DDWL_1 to DDWL_3 may be shown.

As shown in FIG. 10, a dummy program operation may be performed so that a plurality of drain dummy cells may have different threshold voltage distributions based on the locations of the plurality of drain dummy cells. For example, a dummy program operation may be performed so that the drain dummy cells that are coupled to the plurality of drain dummy word lines DDWL_1 to DDWL_3 may have different threshold voltage distributions. The dummy program operation may be performed before a normal program operation on the plurality of memory cells is performed.

More specifically, a dummy program operation may be performed so that the third drain dummy cell that is coupled to the third drain dummy word line DDWL_3 that is the closest to the drain select line may have the highest threshold voltage Vfyc_2 among the first to third drain dummy cells. A dummy program operation may be performed so that the first drain dummy cell that is coupled to the first drain dummy word line DDWL_1 that is the closest to the normal word line may have the lowest threshold voltage Vfya_2 among the first to third drain dummy cells. Lastly, a dummy program operation may be performed so that the second drain dummy cell that is coupled to the second drain dummy cell DDWL_2 may have a threshold voltage Vfyb_2 that is greater than the threshold voltage Vfya_2 of the first drain dummy cell and less than the threshold voltage Vfyc_2 of the third drain dummy cell. In other words, a dummy program operation may be performed so that a drain dummy cell that is closer to a normal word line as opposed to a drain select line may have a lower threshold voltage distribution.

In FIG. 10, during a dummy program operation, different dummy program verify voltages may be applied to the plurality of drain dummy word lines DDWL_1 to DDWL_3 so that the first to third drain dummy cells may have different dummy cell threshold voltages. More specifically, a lower dummy program verify voltage may be applied to a drain dummy word line closer to a normal word line as opposed to a drain select line.

For example, by performing a dummy program operation, the first drain dummy cell may have the threshold voltage Vfya_2 of −1.5 V. The threshold voltage Vfyb_2 of the second drain dummy cell may be −0.5 V. The threshold voltage Vfyc_2 of the third drain dummy cell may be 2.5 V.

During a normal program operation after the dummy program operation, the same dummy word line voltage may be applied to the first to third drain dummy word lines DDWL_1 to DDWL_3.

More specifically, a voltage of 6 V may be applied to each of the first to third drain dummy word lines DDWL_1 to DDWL_3. A channel potential of approximately 6 V to 7.5 V may be formed in the first drain dummy cell on the basis of the difference between the first dummy word line voltage and the threshold voltage Vfya_2 of the first drain dummy cell. Similarly, a channel potential of approximately 5 V to 6.5 V may be formed in the second drain dummy cell on the basis of the difference between the second dummy word line voltage and the threshold voltage Vfyb_2 of the second drain dummy cell. Lastly, a channel potential of approximately 2 V to 3.5 V may be formed in the third drain dummy cell on the basis of the difference between the third dummy word line voltage and the threshold voltage Vfyc_2 of the third drain dummy cell.

The dummy program operation and the normal program operation on the plurality of dummy cells are described with reference to FIG. 10. However, a dummy program operation and a normal program operation on a plurality of source dummy cells may be performed in the same manner as above.

For example, a dummy program operation may be performed so that the source dummy cells that are coupled to the plurality of source dummy word lines may have different threshold voltage distributions. The dummy program operation may be performed so that the plurality of source dummy cells may have different threshold voltage distributions based on the locations of the source dummy cells. For example, a dummy program operation may be performed so that a source dummy cell that is the closest to the source select line may have the highest threshold voltage among the plurality of source dummy cells. A dummy program operation may be performed so that a source dummy cell that is the closest to the normal word line may have the lowest threshold voltage. In other words, a dummy program operation may be performed so that the source dummy cell that is closer to the normal word line as opposed to the source select line may have a lower threshold voltage distribution.

Figure 11:
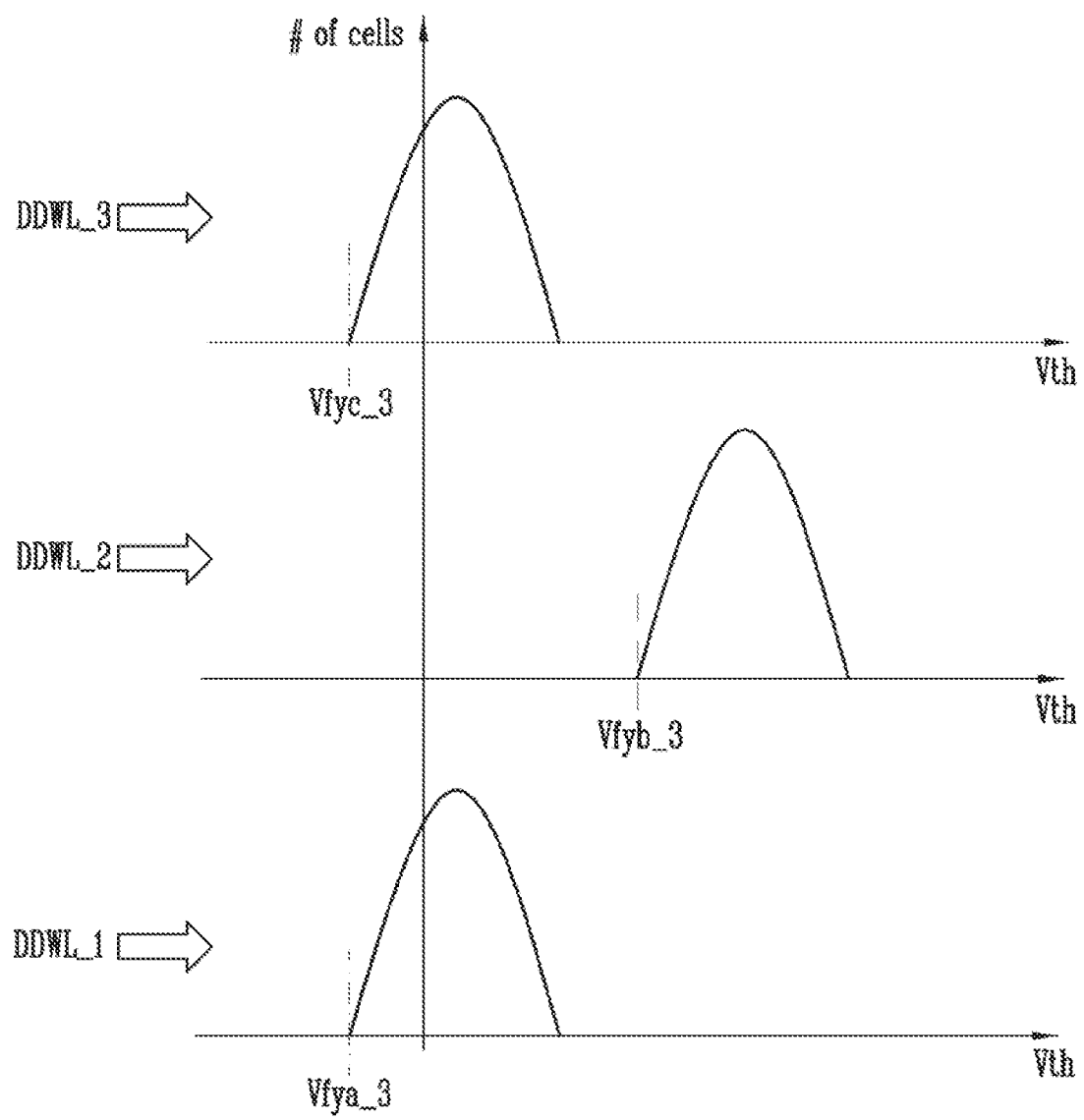
FIG. 11 is a diagram, illustrating threshold voltage distributions of dummy cells based on the locations of dummy word lines, according to an embodiment of the present disclosure.

FIG. 11 is a diagram, illustrating threshold voltage distributions of dummy cells based on the locations of dummy word lines, according to an embodiment of the present disclosure.

Referring to FIG. 11, threshold voltage distributions of the dummy cells that are coupled to the first to third drain dummy word lines DDWL_1 to DDWL_3 may be shown.

As shown in FIG. 11, a dummy program operation may be performed so that the plurality of drain dummy cells may have different threshold voltage distributions based on the locations of the plurality of drain dummy cells. For example, a dummy program operation may be performed so that the drain dummy cells that are coupled to the plurality of drain dummy word lines DDWL_1 to DDWL_3 may have different threshold voltage distributions. The dummy program operation may be performed before a normal program operation on the plurality of memory cells is performed.

More specifically, a threshold voltage Vfya_3 of the first drain dummy cell and a threshold voltage Vfyc_3 of the third drain dummy cell may be the same as each other. The threshold voltage Vfya_3 of the first drain dummy cell and a threshold voltage Vfyb_3 of the second drain dummy cell may be different from each other.

During a dummy program operation, different dummy program verify voltages may be applied to at least two of the first to third drain dummy word lines DDWL_1 to DDWL_3. More specifically, the same dummy program verify voltage may be applied to the third drain dummy word line DDWL_3 and the first drain dummy word line DDWL_1, and a different dummy program verify voltage may be applied to the second dummy word line DDWL_2.

According to an embodiment, by performing a dummy program operation, the first drain dummy cell's threshold voltage Vfya_3 and the third drain dummy cell's threshold voltage Vfyc_3 each may be −0.5 V. The threshold voltage Vfyb_3 of the second drain dummy cell may be 0.5 V.

During a normal program operation, a voltage of 7 V may be applied to each of the first and second drain dummy word lines DDWL_1 and DDWL_2, and a voltage of 3 V may be applied to the third drain dummy word line DDWL_3.

A channel potential of approximately 6 V to 7.5 V may be formed in the first drain dummy cell on the basis of the difference between the first dummy word line voltage and the threshold voltage Vfya_3 of the first drain dummy cell. Similarly, a channel potential of approximately 5 V to 6.5 V may be formed in the second drain dummy cell on the basis of the difference between the second dummy word line voltage and the threshold voltage Vfyb_3 of the second drain dummy cell. Lastly, a channel potential of approximately 2 V to 3.5 V may be formed in the third drain dummy cell on the basis of the difference between the third dummy word line voltage and the threshold voltage Vfyc_3 of the third drain dummy cell.

Therefore, a higher channel potential may be formed in a direction from the drain select line to the normal word line, i.e., in a direction from the third drain dummy cell to the first drain dummy cell.

According to another embodiment, for convenience of explanation, FIG. 11 illustrates only the plurality of drain dummy word lines DDWL_1 to DDWL_3 between the drain select line DSL and a normal word line WL. However, a dummy program operation and a normal program operation may be performed on a plurality of source dummy word lines between the source select line SSL and the normal word line WL.

The dummy program operation and the normal program operation on the plurality of dummy cells are described with reference to FIG. 11. However, a dummy program operation and a normal program operation on a plurality of source dummy cells may be performed in the same manner as above.

Figure 12:
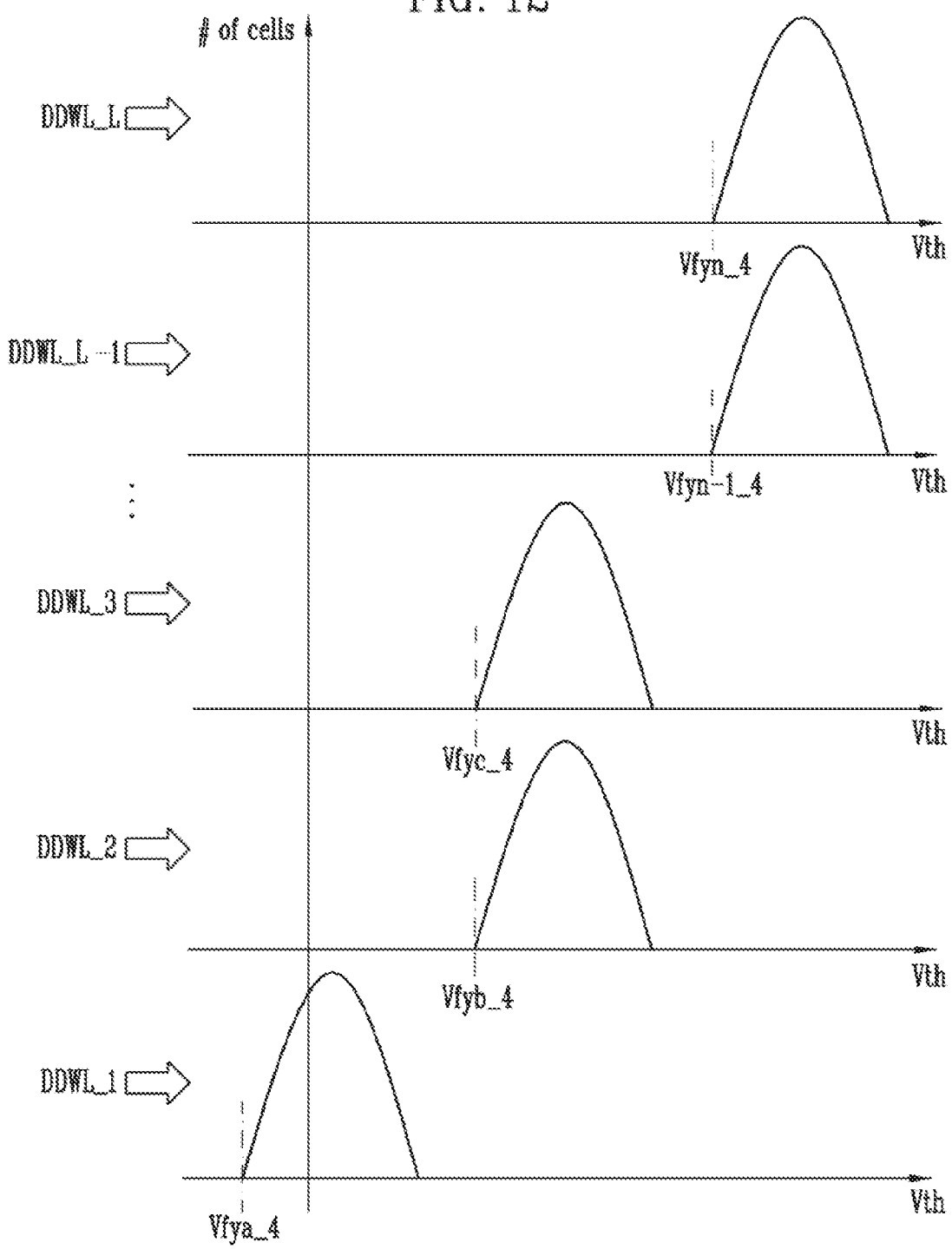
FIG. 12 is a diagram, illustrating threshold voltage distributions of dummy cells based on the locations of dummy word lines, according to an embodiment of the present disclosure.

FIG. 12 is a diagram, illustrating threshold voltage distributions of dummy cells based on the locations of dummy word lines, according to an embodiment of the present disclosure.

Referring to FIG. 12, a threshold voltage distribution of the drain dummy cells that are coupled to the first to Lth drain dummy word lines DDWL_1 to DDWL_L may be shown, wherein L is a positive integer. During a normal program operation on a plurality of memory cells, a dummy program operation may be performed before the normal program operation so as to obtain gentle variations in channel potential between a drain select line and a plurality of normal word lines.

A dummy program operation may be performed so that a plurality of drain dummy cells may have different threshold voltage distributions. A dummy program operation may be performed so that at least two of the plurality of drain dummy cells may have the same threshold voltage distribution. For the above threshold voltage distributions of the dummy cells, the same dummy program verify voltage may be applied to two or more drain dummy word lines.

As shown in FIG. 12, the Lth drain dummy cell and the (L−1)th drain dummy cell adjacent to each other may have threshold voltages vfyn_4 and vfyn-1_4, respectively, which are the same as each other. The third drain dummy cell and the second drain dummy cell may have threshold voltages vfyc_4 and vfyb_4, respectively, which are the same as each other.

During a dummy program verify operation, the same dummy program verify voltage may be applied to the Lth and (L−1)th drain dummy word lines DDWL_L and DDWL_L−1. In addition, the same dummy program verify voltage may be applied to the second and third drain dummy word lines DDWL_2 and DDWL_3.

A dummy program operation may be performed so that a drain dummy cell that is closer to the plurality of normal words lines as opposed to the drain select line may have a lower threshold voltage distribution. For example, a threshold voltage Vfyn_4 the Lth drain dummy cell and a threshold voltage Vfyn1_4 of the (L−1)th drain dummy cell may be greater than the threshold voltage vfyc_4 of the third drain dummy cells and the threshold voltage vfyb_4 of the second drain dummy cell. The threshold voltage vfyc_4 of the third drain dummy cells and the threshold voltage vfyb_4 of the second drain dummy cell may be greater than a threshold voltage vfya_4 of the first drain dummy cells.

According to an embodiment, for convenience of explanation, two adjacent drain dummy cells may have the same threshold voltage. However, in various embodiments, three or more drain dummy cells may have the same threshold voltage.

Referring to FIG. 12, during a dummy program verify operation, the same dummy program verify voltage may be applied to the Lth and (L−1)th drain dummy word lines DDWL_L and DDWL_L−1. In addition, the same dummy program verify voltage may be applied to the second and third drain dummy word lines DDWL_2 and DDWL_3.

According to an embodiment, during a normal program operation, the same dummy word line voltage may be applied to drain dummy cells with different threshold voltage distributions. Different dummy word line voltages may be applied to different drain dummy cells with the same threshold voltage distribution. Dummy word line voltages applied to a plurality of drain dummy cells may be determined so that a channel potential of the plurality of dummy cells may increase gradually toward the normal word line from the drain select line.

According to another embodiment, during a normal program operation, dummy word line voltages with the same voltage level may be applied to all drain dummy word lines DDWL_1 to DDWL_L. In this embodiment, since the threshold voltages Vfyn_4 and Vfyn-1_4 of the Lth and (L−1)th drain dummy cells are the same, and threshold voltages Vfvc_4 and Vfvb_4 of the third and second drain dummy cells are the same, the channel potential of the plurality of drain dummy cells may be increased stepwise from the drain select line toward the normal word line.

The dummy program operation and the normal program operation performed on the plurality of drain dummy cells are described with reference to FIG. 12. However, a dummy program operation and a normal program operation on a plurality of source dummy cells may be performed in the same manner as above.

Figure 13:
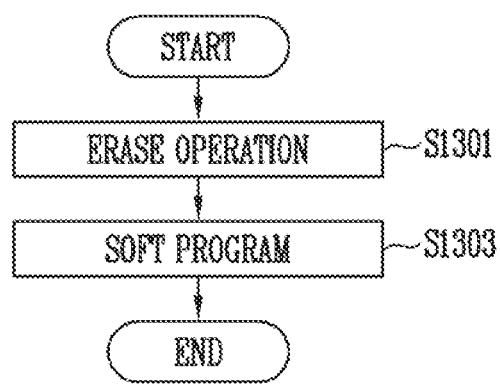
FIG. 13 is a flowchart, illustrating an erase operation and a soft program operation of a memory device of FIG. 1, according to an embodiment of the present disclosure.

FIG. 13 is a flowchart, illustrating an erase operation and a soft program operation of the memory device 100 of FIG. 1, according to an embodiment of the present disclosure.

Referring to FIG. 13, at step S1301, the memory device may perform an erase operation on a plurality of memory cells. The erase operation may be performed to move threshold voltage distributions of the plurality of memory cells to a threshold voltage distribution corresponding to an erase state. The plurality of memory cells may have different threshold voltage distributions based on stored data. Therefore, based on the existing threshold voltage distributions, memory cells that are overerased in comparison with a normal distribution may occur after an erase operation.

At step S1303, the memory device may perform a soft program operation. The soft program operation may be performed so that the memory cells falling outside the normal distribution after the erase operation may be moved to the normal distribution.

According to an embodiment, the soft program operation may include a dummy program operation on dummy cells and a normal program operation on normal cells. The dummy program operation may be performed prior to the normal program operation so that a plurality of dummy cells may have target threshold voltage distributions.

Figure 14:
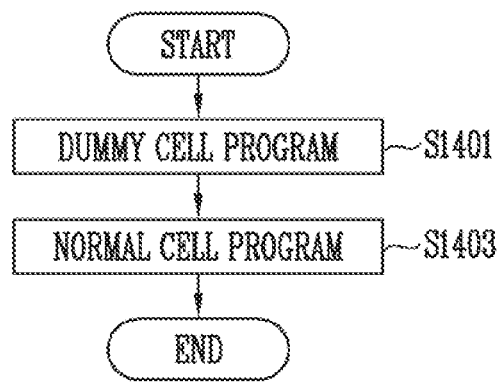
FIG. 14 is a flowchart, illustrating a dummy program operation and a normal program operation of a memory device of FIG. 1, according to an embodiment of the present disclosure.

FIG. 14 is a flowchart, illustrating a dummy program operation and a normal program operation of the memory device 100 of FIG. 1, according to an embodiment of the present disclosure.

Referring to FIG. 14, at step S1401, the memory device may perform a dummy program operation on the plurality of dummy cells. The memory device may perform the dummy program operation on the plurality of dummy cells that are coupled in series between the select transistor and normal cells. The memory device may perform the dummy program operation so that the plurality of dummy cells may have different threshold voltages based on the locations of dummy cells. The memory device may perform the dummy program operation so that a dummy cell may have a higher threshold voltage toward the select transistor from the normal cells.

The memory device may perform a dummy program verify operation by applying different dummy word line verify voltages to a plurality of dummy word lines coupled to the plurality of dummy cells based on the locations of the dummy word lines.

At step S1403, the memory device may perform a normal program operation on the plurality of normal cells. The memory device may apply a program voltage to a selected word line among a plurality of word lines coupled to the plurality of normal cells. The memory device may apply a program pass voltage to an unselected word line among the plurality of word lines. The memory device may apply the same dummy word line voltage to the plurality of dummy word lines during a normal program operation. The dummy word line voltage may be equal to or smaller than the program pass voltage. According to various embodiments, the memory device may apply different dummy word line voltages to at least two dummy word lines among the plurality of dummy word lines.

Figure 15:
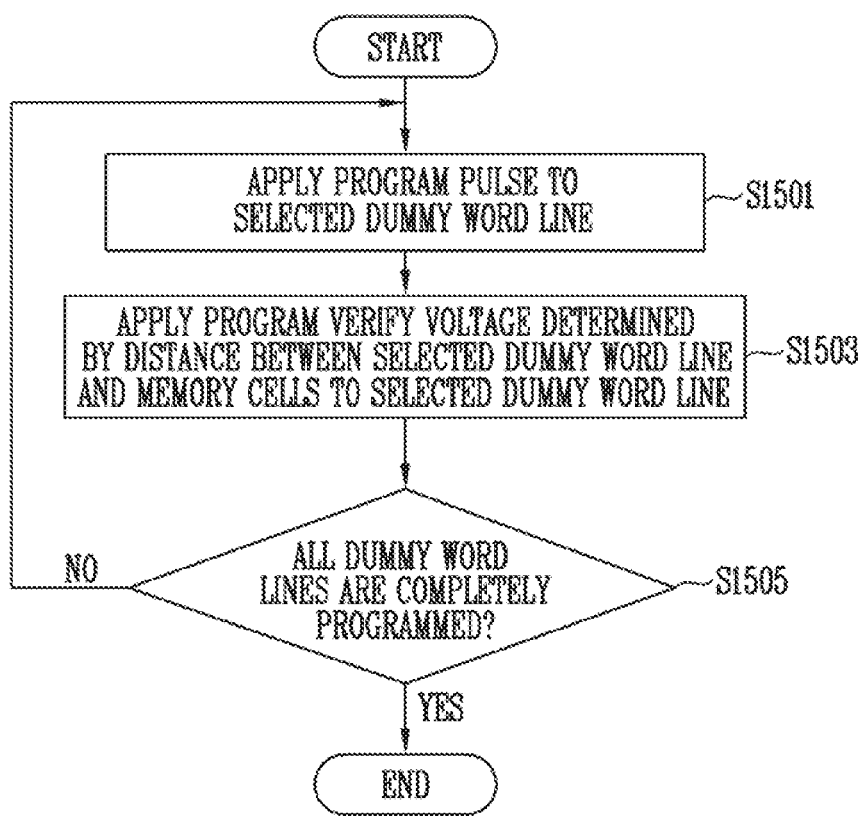
FIG. 15 is a detailed flowchart, illustrating operations of a dummy program operation, shown in FIG. 14.

FIG. 15 is a detailed flowchart, illustrating operations of a dummy program operation, shown in FIG. 14.

Referring to FIG. 15, at step S1501, the memory device may apply a program pulse to a selected dummy word line among a plurality of dummy word lines coupled to a plurality of dummy cells.

At step S1503, the memory device may apply a program verify voltage determined by the distance between the selected dummy word line and normal memory cells to the selected dummy word line.

At step S1505, the memory device may determine whether the dummy program operation on all dummy word lines has been completed. As a result of determination, if the dummy program operation has been completed, the process flow may be terminated. Otherwise, the process flow may proceed to step S1501.

At step S1505, both steps S1501 and S1503 may be repeated until the dummy program operation on all dummy word lines is completed. At step S1505, when the dummy program operation on all dummy word lines is completed, the dummy program operation may be terminated.

According to embodiments of the invention, a memory device with a reduced chip size and an operating method thereof may be provided.

What is claimed is:

1. A memory device, comprising:
   a cell string including a select transistor, a plurality of memory cells, and a plurality of dummy cells coupled in series between the select transistor and the plurality of memory cells;
   a peripheral circuit configured to perform a dummy program operation to sequentially apply a dummy program voltage and a dummy program verify voltage to each of the plurality of dummy cells; and
   a control logic configured to differently control a level of the dummy program verify voltage to be applied to the each of the plurality of dummy cells.

2. The memory device of claim 1, wherein the control logic is further configured to control the peripheral circuit to apply the dummy program verify voltage with a first level to a first dummy word line, and apply the dummy program verify voltage with a second level different from the first level to a second dummy word line, among a plurality of dummy word lines that are coupled to the plurality of dummy cells.

3. The memory device of claim 2, wherein the dummy program operation is performed before a normal program operation on the plurality of memory cells.

4. The memory device of claim 2, wherein the control logic comprises:
   a voltage level storage storing level information on levels corresponding to the plurality of dummy cells, respectively; and
   a program operation controller configured to:
   select a level corresponding to a position of a selected dummy cell of the plurality of dummy cells from among the levels included in the level information; and
   control the peripheral circuit to apply the dummy program verify voltage with the selected level to the selected dummy cell.

5. The memory device of claim 2, wherein a first threshold voltage of a first dummy cell closer to the plurality of memory cells is lower than a second threshold voltage of a second dummy cell farther from the plurality of memory cells, among the plurality of dummy cells, after the dummy program operation is performed.

6. The memory device of claim 2, wherein the first dummy word line is coupled to a first dummy cell, and the second dummy word line is coupled to a second dummy cell which is located farther from the plurality of memory cells than the first dummy cell, among the plurality of dummy cells, and
   wherein the first level of the dummy program verify voltage applied to the first dummy word line is lower than the second level of the dummy program verify voltage applied to the second dummy word line.

7. The memory device of claim 2, wherein at least two dummy cells among the plurality of dummy cells have a same threshold voltage after the dummy program operation is performed.

8. The memory device of claim 2, wherein the control logic is further configured to control the peripheral circuit to apply the dummy program verify voltage with a same level to at least two dummy word lines among the plurality of dummy word lines during the dummy program operation.

9. The memory device of claim 3, wherein the control logic is further configured to control the peripheral circuit to apply a voltage with a same level to the plurality of dummy word lines during the normal program operation.

10. A method of operating a memory device including a select transistor, a plurality of memory cells, and a plurality of dummy cells coupled in series between the select transistor and the plurality of memory cells, the method comprising:
applying a dummy program voltage to a selected dummy word line coupled to a selected dummy cell among the plurality of dummy cells; and
applying, to the selected dummy word line, a dummy program verify voltage with a voltage level corresponding to a distance between the selected dummy cell and the plurality of memory cells.

11. The method of claim 10, wherein the applying of the dummy program verify voltage comprises applying the dummy program verify voltage with a lower voltage level to the selected dummy word line coupled to the selected dummy cell that is closer to the plurality of memory cells.

12. The method of claim 10, wherein the applying of the dummy program verify voltage comprises applying the dummy program verify voltage with a greater voltage level to the selected dummy word line coupled to the selected dummy cell that is closer to the select transistor.

13. The method of claim 10, wherein the applying of the dummy program verify voltage comprises applying the dummy program verify voltage with the voltage level equal to a voltage level of the dummy program verify voltage applied to a dummy word line, that is adjacent to the selected dummy word line, to the selected dummy word line.

14. A memory device, comprising:
a cell string including a select transistor, a plurality of memory cells, and a plurality of dummy cells coupled in series between the select transistor and the plurality of memory cells; and
a peripheral circuit configured to perform a dummy program operation on each of the plurality of dummy cells using a dummy program verify voltage with a voltage level corresponding to a position of the each of the plurality of dummy cells,
wherein a dummy cell that is closer to the plurality of memory cells has a lower threshold voltage than a dummy cell that is farther from the plurality of memory cells after the dummy program operation is performed.

15. The memory device of claim 14, wherein a dummy cell that is closer to the select transistor has a higher threshold voltage after the dummy program operation is performed.

16. The memory device of claim 14, further comprising:
a control logic configured to control the peripheral circuit to apply voltages with a same voltage level to the plurality of dummy cells during a normal program operation to store data in the plurality of memory cells.

17. The memory device of claim 14, wherein the peripheral circuit further comprises a voltage generator configured to generate voltages for the dummy program operation.

18. A method of operating a memory device including a select transistor, a plurality of memory cells, and a plurality of dummy cells coupled in series between the select transistor and the plurality of memory cells, the method comprising:
programming the plurality of dummy cells using dummy program verify voltages with different voltage levels, respectively;
performing a normal program operation on the plurality of memory cells; and
applying voltages with a same voltage level to a plurality of dummy word lines that are coupled to the plurality of dummy cells during the normal program operation.

19. The method of claim 18, wherein the applying of the voltages comprises generating a greater channel voltage to a dummy word line that is closer to the plurality of memory cells, among the plurality of dummy word lines.

* * * * *